(12) United States Patent
Yajima et al.

(10) Patent No.: US 7,733,190 B2
(45) Date of Patent: Jun. 8, 2010

(54) OSCILLATION CIRCUIT AND OSCILLATOR (75) Inventors: Aritsugu Yajima, Matsumoto (JP);
Takehiko Adachi, Yokohama (JP)

(73) Assignee: Seiko Epson Corporation (JP)

( * ) Notice: Subject to any disclaimer, the term of this patent is extended or adjusted under 35 U.S.C. 154(b) by 44 days.

(21) Appl. No.: 12/037,562

(22) Filed: Feb. 26, 2008

(65) Prior Publication Data

US 2009/0072917 A1 Mar. 19, 2009

(30) Foreign Application Priority Data

Feb. 27, 2007 (JP) ............................ 2007-046601
Feb. 6, 2008 (JP) ............................ 2008-026011

(51) Int. Cl.
*H03B 5/32* (2006.01)
*H03B 9/12* (2006.01)
*H03H 9/02* (2006.01)

(52) U.S. Cl. .................. 331/107 A; 331/108 R; 331/116 R; 331/116 FE; 331/117 FE; 331/154; 331/158; 331/162; 331/175; 331/185; 331/186

(58) Field of Classification Search ............ 331/108 R, 331/116 R, 116 FE, 117 FE, 154, 158, 162, 331/175, 185, 186, 107 A
See application file for complete search history.

(56) References Cited

U.S. PATENT DOCUMENTS

| 3,581,235 | A | * | 5/1971 | Siu ......................... 331/113 R |
| 3,585,526 | A | * | 6/1971 | Zelinka .................. 331/113 R |
| 3,754,152 | A | * | 8/1973 | Koehler et al. .............. 310/318 |
| 3,963,996 | A | * | 6/1976 | Skerlos .................... 331/117 R |
| 4,353,039 | A | * | 10/1982 | Huntley ................... 331/113 R |
| 5,347,237 | A | * | 9/1994 | Rokos ................... 331/116 FE |
| 6,225,872 | B1 | * | 5/2001 | Verhoeven .................. 331/143 |
| 6,380,816 | B1 | * | 4/2002 | Okaguchi .................... 331/167 |
| 6,577,204 | B2 | * | 6/2003 | Midtgaard ................... 331/158 |
| 6,696,899 | B2 | * | 2/2004 | Ruffieux .................... 331/158 |
| 6,956,443 | B2 | * | 10/2005 | Ruffieux .................... 331/158 |
| 7,099,646 | B1 | * | 8/2006 | Jin et al. ..................... 455/313 |
| 2005/0046505 | A1 | * | 3/2005 | Gomez ....................... 331/167 |
| 2006/0055480 | A1 | * | 3/2006 | Darrer et al. ................ 331/167 |
| 2007/0132521 | A1 | * | 6/2007 | Lee et al. .................... 331/167 |
| 2008/0088390 | A1 | * | 4/2008 | Cathelin et al. ............. 333/188 |

FOREIGN PATENT DOCUMENTS

| JP | 06-252751 | 9/1994 |
| JP | 2006-060687 | 3/2006 |

OTHER PUBLICATIONS

Behzad Razavi, "Design of Analog CMOS Integrated Circuits", McGraw-Hill Series in Electrical and Computer Engineering, p. 611 (2001) (Article and English Translation).

* cited by examiner

*Primary Examiner*—Arnold Kinkead
*Assistant Examiner*—Richard Tan
(74) *Attorney, Agent, or Firm*—Harness, Dickey & Pierce, P.L.C.

(57) ABSTRACT

An oscillation circuit includes a cross-coupled circuit having a first active element and a second active element which are differentially connected to each other. The oscillation circuit oscillates in a resonance frequency of a resonator connected between the first active element and the second active element.

6 Claims, 6 Drawing Sheets

OSCILLATION CIRCUIT AND OSCILLATOR

BACKGROUND

1. Technical Field

The present invention relates to an oscillation circuit having a cross-coupled circuit and an oscillator having the oscillation circuit and a resonator.

2. Related Art

In the past, a Colpitts oscillation circuit was usually used as an oscillation circuit using a resonator. It is known that a gain of 4 or more is required for oscillation of the Colpitts oscillation circuit (for example, see "Design Application of Analog CMOS Integrated Circuit" (page 611), written by Seishiro MURATA and issued on Jul. 30, 2005). Since the gain is proportional to a negative resistance, the negative resistance proportional to the gain of 4 or more should be set to oscillate.

On the other hand, most of mobile communication devices and sensor networks are driven by a battery. Accordingly, it is preferable that the power consumption of an oscillation circuit is as low as possible while satisfying a desired operation. The current to be applied should be reduced to reduce the power consumption of the oscillation circuit. However, when the current is reduced, the gain is also reduced. Since the gain and the negative resistance are proportional to each other, the decrease in gain causes a decrease in negative resistance. Therefore, it is difficult to satisfy the oscillation condition.

A study for reducing inter-terminal capacitance of a resonator which is a reason for reducing the negative resistance, or minimizing a parasitic component in a circuit layout has been made to solve the above-mentioned problem, but did not increase the negative resistance.

In order to solve the above-mentioned problem, in JP-A-2006-60687, the negative resistance at a desired frequency is increased by providing a negative resistance increasing circuit. This circuit constitutes a feedback circuit for feeding back the output of an oscillation circuit through a capacitor, thereby increasing the negative resistance.

An oscillation circuit using a cross-coupled circuit is also known (for example, see U.S. Pat. No. 6,696,899). In U.S. Pat. No. 6,696,899, a resonator is connected between drains of a pair of active elements (MOS transistors) and the oscillation circuit is made to oscillate in an anti-resonance frequency of the resonator.

However, in JP-A-2006-60687, since a new circuit is required for increasing the negative resistance, the power corresponding to the power consumption of the new circuit is increased. Since the negative resistance is affected by the precision in feedback capacity, the negative resistance may get non-uniform, thereby not providing the desired negative resistance.

In general, it is known in an oscillation circuit using the anti-resonance frequency that the Q characteristic of the resonator is more deteriorated than that in the oscillation circuit using a resonance frequency. Accordingly, in the configuration described in U.S. Pat. No. 6,696,899, it is considered that it is difficult to embody an oscillation circuit having an excellent Q characteristic of a resonator.

SUMMARY

The invention can be embodied as follows.

According to an aspect of the invention, there is provided an oscillation circuit comprising a cross-coupled circuit having a first active element and a second active element which are differentially connected to each other. Here, the oscillation circuit oscillates in a resonance frequency of a resonator connected between the first active element and the second active element.

For example, a MOS transistor can be employed as the first active element and the second active element.

According to this configuration, it is preferable that the gain of the cross-coupled circuit is $\sqrt{2}$ or more. When the gain required for oscillation is small, it is possible to reduce current. Accordingly, it is possible to reduce the power consumption of the circuit.

Since the first active element and the second active element are alternately activated, it is possible to reduce the current consumption of the cross-coupled circuit up to a half. Accordingly, it is possible to reduce the power consumption of the circuit.

Since the oscillation circuit uses the resonance frequency of the resonator, it is possible to embody an oscillation circuit having an excellent Q characteristic.

In the oscillation circuit, it is preferable that a source terminal of the first active element is connected to GND through a first source load circuit, a source terminal of the second active element is connected to GND through a second source load circuit, a drain terminal of the first active element is connected to a voltage source through a first drain load circuit, a drain terminal of the second active element is connected to a voltage source through a second drain load circuit, impedance of the first source load circuit is equal to or greater than impedance of the first drain load circuit, and impedance of the second source load circuit is equal to or greater than impedance of the second drain load circuit.

According to this configuration, it is possible to suppress the oscillation circuit from oscillating when the frequency is smaller than the resonance frequency of the resonator. This is because the impedance of the resonator is great when the frequency is smaller than the resonance frequency. Here, when the impedance of the first source load circuit has a value not depending on the frequency, the impedance of the first source load circuit is dominant in the impedance between the source terminal of the first active element and the GND. Here, the gain of the oscillation circuit is a ratio of the impedance of the first drain load circuit to the impedance between the source terminal of the first active element and the GND. Accordingly, the gain of the oscillation circuit is determined as a ratio of the impedance of the first drain load circuit to the impedance of the first source load circuit. Therefore, when the impedance magnitude of the first source load circuit is equal to or greater than the impedance magnitude of the first drain load circuit, the gain is 1 or less and thus the oscillation circuit does not oscillate. The same is true of the relation between the impedance of the second source load circuit and the impedance of the first drain load circuit.

It is preferable that the oscillation circuit further includes a capacitor connected between the drain terminal of the first active element and the drain terminal of the second active element.

According to this configuration, when the frequency of the oscillation circuit is greater than the resonance frequency of the resonator, it is possible to prevent the oscillation circuit from oscillating. This is because the impedance of a parallel capacitor in the equivalent circuit of the resonator is dominant in the impedance between the source terminal of the first active element and the GND. By providing a capacitor connected between the drain terminal of the first active element and the drain terminal of the second active element, the impedance of the capacitor is dominant in the impedance between the drain terminal of the first active element and the voltage source. The gain can be expressed as a ratio of the impedance of the capacitor to the impedance of the parallel capacitor. Accordingly, by providing the capacitor, it is possible to prevent the oscillation at a frequency other than the resonance frequency without increasing the gain. The same is true of the relation between the impedance between the source terminal of the second active element and the GND and the impedance between the drain terminal of the second active element and the voltage source.

In the oscillation circuit, it is preferable that the capacitance of the capacitor is a half parallel capacitance of the resonator.

According to this configuration, even when the impedance between the source terminal of the first active element and the GND increases, the impedance between the drain terminal of the first active element and the voltage source also increases, thereby suppressing the gain. Accordingly, it is possible to prevent the oscillation at a frequency greater than the resonance frequency of the resonator. The same is true of the second active element.

It is preferable that the oscillation circuit further includes a capacitor connected in parallel to the first drain load circuit and a capacitor connected in parallel to the second drain load circuit.

According to this configuration, by providing the capacitor connected in parallel to each of the first drain load circuit and the second drain load circuit, the capacitance between the drain terminal and the voltage source is smaller than the parallel capacitance of the resonator. Accordingly, the impedance of each drain terminal is smaller than the impedance (impedance of the source terminal side) of the parallel capacitor in the resonator and thus the gain at a frequency other than the resonance frequency is deteriorated, thereby preventing the oscillation at a frequency other than the resonance frequency.

In the oscillation circuit, it is preferable that the capacitance of the capacitor is a half parallel capacitance of the resonator.

According to this configuration, since the total impedance of each drain terminal side is smaller than the impedance of each source terminal, the gain at a frequency other than the resonance frequency is decreased, thereby preventing the oscillation at a frequency other than the resonance frequency.

In the oscillation circuit, it is preferable that each of the first source load circuit, the second source load circuit, the first drain load circuit, and the second drain load circuit includes a static current circuit.

By forming the first drain load circuit and the second drain load circuit out of a static current circuit and forming the first source load circuit and the second source load circuit out of a static current circuit, the impedance of each drain terminal side can be set smaller than the impedance of each source terminal side, thereby preventing the oscillation at a frequency smaller than the resonance frequency of the resonator.

In the oscillation circuit, it is preferable that each of the first source load circuit and the second source load circuit includes a capacitor and an inductor connected in parallel to each other and that each of the first drain load circuit and the second drain load circuit includes a capacitor and an inductor connected in parallel to each other.

The circuit formed by the capacitor and the inductor connected in parallel to each other is called an LC parallel resonance circuit. In order to maximize the gain by the use of the cross-coupled circuit (that is, to facilitate the oscillation), the LC constant can be set to maximize the impedance of the drain terminal side. Accordingly, since the LC parallel resonance circuit has frequency selectivity, it can most easily oscillate at the resonance frequency.

By setting the frequency of the LC parallel resonance circuit connected to the source terminal side to the frequency band of abnormal oscillation, the impedance of the source terminal side can be intentionally increased, thereby preventing the abnormal oscillation. That is, the abnormal oscillation can be prevented by setting the LC constant to the frequency band of the abnormal oscillation.

In the oscillation circuit, it is preferable that each of the first source load circuit, the second source load circuit, the first drain load circuit, and the second drain load circuit includes a static current circuit, and that an amplitude fixation circuit is disposed between the source terminal and the drain terminal of the first active element and between the source terminal and the drain terminal of the second active element.

According to this configuration, the output amplitude of the oscillation circuit is fixed by setting the amplitude fixation circuit. When the output amplitude is fixed, it is possible to reduce an oscillation start time.

Since a circuit not depending on a common mode of the active elements exists, it is not affected by the mismatch or offset between the first active element and the second active element. Accordingly, it is possible to embody a circuit which can reduce a start time and which can be driven with a low voltage or have noise resistance.

In the oscillation circuit, it is preferable that a capacitor is disposed between the gate terminal of the first active element and the drain terminal of the second active element and between the gate terminal of the second active element and the drain terminal of the first active element.

According to this configuration, by disposing the capacitor as described above, the gate and the drain of the MOS transistor can be loosely coupled to each other (be separated in impedance to the maximum), thereby improving the linearity of the circuit (decreasing the deformation of the circuit). The high-frequency oscillation is suppressed, thereby improving the noise resistance.

In the oscillation circuit, it is preferable that an amplifier is disposed between the gate terminal and the drain terminal of the first active element and the gate terminal and the drain terminal of the second active element.

According to this configuration, a desired gain can be obtained with the improvement in linearity of the circuit, by using the amplifier. Accordingly, it is easily to design an oscillation circuit.

According to another aspect of the invention, there is provided an oscillator including: an oscillation circuit including a cross-coupled circuit having a first active element and a second active element which are differentially connected to each other; and a resonator that is connected between the source terminals of the first active element and the second active element and that oscillates in a resonance frequency of a resonator.

According to this configuration, since it includes the above-mentioned oscillation circuit, it is possible to embody an oscillator which can be driven with low voltage and low current and which has high noise resistance and excellent oscillation start characteristic.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, exemplary embodiments of the invention will be described with reference to the accompanying drawings.

First Embodiment

Figure 1:
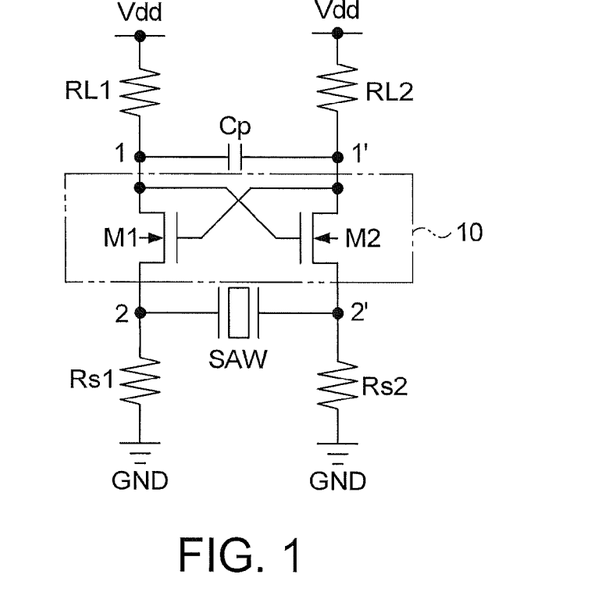
FIG. 1 is a circuit diagram illustrating an example of an oscillation circuit according to a first embodiment of the invention.

FIG. 1 is a circuit diagram illustrating an example of an oscillation circuit according to a first embodiment of the invention. In FIG. 1, a cross-coupled circuit 10 includes an Nch transistor M1 (hereinafter, simply referred to as "transistor M1") as a first active element and an Nch transistor M2 (hereinafter, simply referred to as "transistor M2") as a second active element which are differentially connected to each other. That is, the drain terminal of the transistor M1 is connected to the gate terminal of the transistor M2 and the drain terminal of the transistor M2 is connected to the gate terminal of the transistor M1.

The source terminal 2 of the transistor M1 is connected to a resistor Rs1 as a first source load circuit and the resistor Rs1 is connected to the GND. Similarly, the source terminal 2' of the transistor M2 is connected to a resistor Rs2 as a second source load circuit and the resistor Rs2 is connected to the GND.

The drain terminal of the transistor M1 is connected to a resistor RL1 as a first drain load circuit and the resistor RL1 is connected to a voltage source Vdd. Similarly, the drain terminal of the transistor M2 is connected to a resistor RL2 as a second drain load circuit and the resistor RL2 is connected to the voltage source Vdd.

A resonator is connected between the source terminal 2 of the transistor M1 and the source terminal 2' of the transistor M2. In this embodiment, a SAW (Surface Acoustic Wave) element is employed as the resonator. The oscillation circuit according to this embodiment oscillates at a resonance frequency of the resonator SAW.

In the following embodiments, a circuit not including the resonator SAW is called an oscillation circuit and a circuit including the resonator SAW is called an oscillator.

A capacitor Cp is connected between the drain terminal 1 of the first transistor M1 and the drain terminal 1' of the second transistor M2.

A relation between the operation of the differential connection and the power consumption and a relation between the gain and the power consumption required to oscillate.

Operation of Differential Connection

The operation of the differential connection is first described. When the transistor M1 is turned on, the transistor M2 is turned off. On the contrary, when the transistor M1 is turned off, the transistor M2 is turned on. In this way, in the cross-coupled circuit 10, the transistor M1 and the transistor M2 are alternately turned on and off. That is, the transistor M1 and the transistor M2 operate alternately. Accordingly, in view of the entire cross-coupled circuit, the current flowing in the drain terminal is ½.

Gain Required for Oscillation

The gain required for the oscillation of the cross-coupled circuit 10 will be described now. In order to allow the cross-coupled circuit 10 to oscillate, it is required that the gain is greater than 1. The gain is a product of mutual conductance and load resistance and when it is assumed that the mutual conductance is gm1 and the load resistance Rp1, the oscillation condition is expressed as follows.

$$gm1 \times Rp1 > 1 \qquad \text{Expression 1}$$

As described in "Operation of Differential Connection", in view of the entire cross-coupled circuit, the current flowing in the drain terminal is ½. That is, in consideration of a circuit, the current flowing in the transistor can be considered as ½. Since the mutual conductance is proportional to a square root of the current, the mutual conductance of a circuit is $1/\sqrt{2}$. That is, when it is assumed that the mutual conductance of the circuit is gm2, the mutual conductance gm2 can be expressed as follows.

$$gm2 = (1/\sqrt{2}) \times gm1 \qquad \text{Expression 2}$$

Accordingly, the following expression can be obtained from Expressions 1 and 2.

$$gm2 \times Rp1 \geq (1/\sqrt{2}) \qquad \text{Expression 3}$$

That is, the gain required for oscillation of the circuit is $1/\sqrt{2}$ or more. When the gain required for oscillation is small, it is possible to reduce the current.

Accordingly, the current can be reduced, thereby reducing the power consumption of the circuit.

Relation Between Impedance of Source Load Circuit and Drain Load Circuit

A relation between the impedance magnitude of the resistor Rs1 (hereinafter, may be referred to as resistance) and the resistance of the resistor RL1 and a relation between the resistance of the resistor Rs2 and the resistance of resistor RL2 will be described now. In this embodiment, the resistance of the resistor Rs1 is equal to or greater than the resistance of the resistor RL1 and the resistance of the resistor Rs2 is equal to or greater than the resistance of the resistor RL2.

Figure 2:
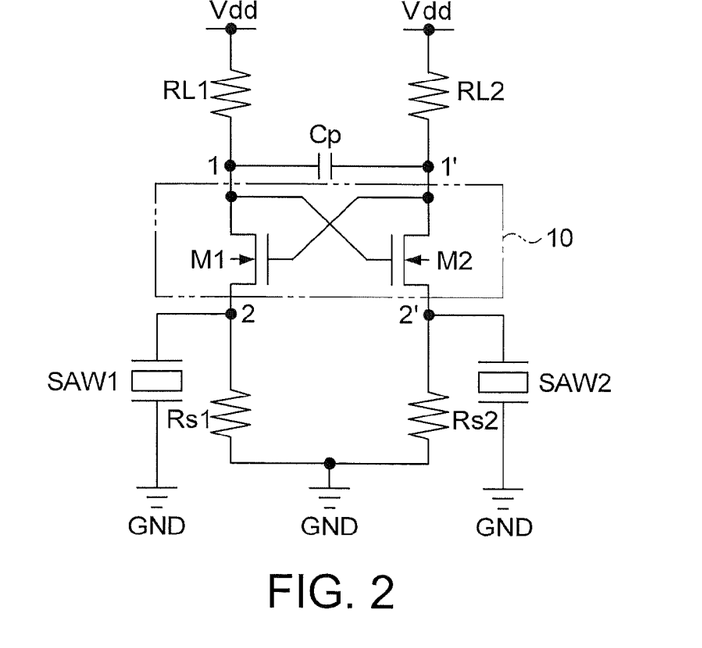
FIG. 2 is a circuit diagram illustrating an oscillation circuit equivalent to the oscillation circuit shown in FIG. 1.

FIG. 2 is a circuit diagram illustrating an oscillation circuit equivalent to the oscillation circuit shown in FIG. 1, where the resonator SAW is divided. As shown in FIG. 2, the resonator SAW can be conceptually divided into a resonator SAW1 and a resonator SAW2. The impedance of the resonator SAW1 and the impedance of the resonator SAW2 are ½ of the impedance of the resonator SAW.

Figure 3:
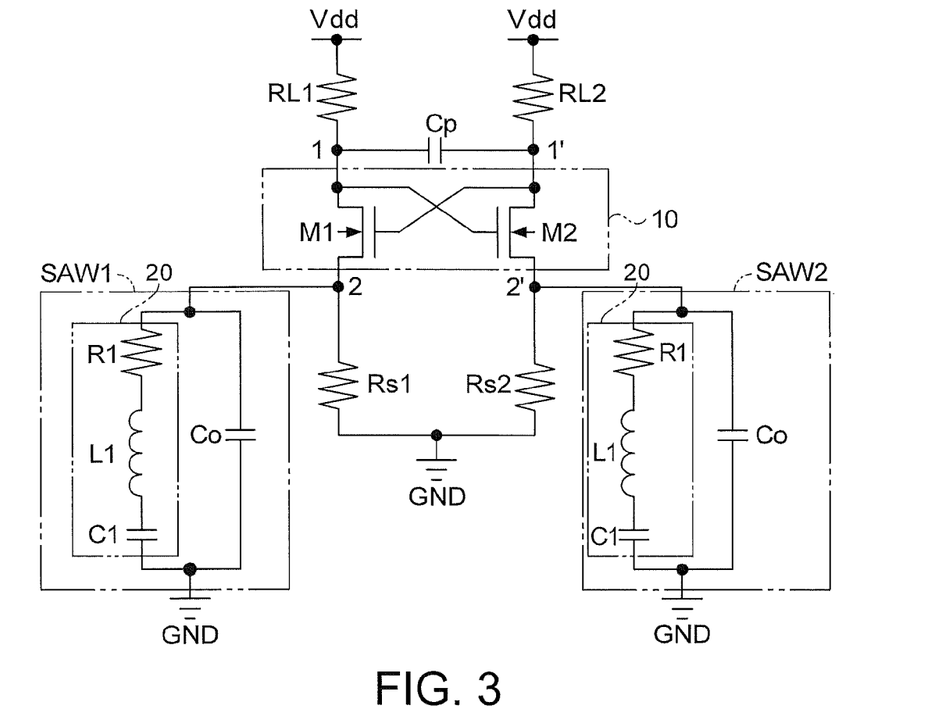
FIG. 3 is a circuit diagram illustrating an oscillation circuit equivalent to the oscillation circuit shown in FIG. 1, where a resonator is expressed by an equivalent circuit.

When it is intended to express the resonator SAW1 and the resonator SAW2 by the use of an equivalent circuit, the oscillation circuit shown in FIG. 2 can be expressed as shown in FIG. 3. The gain of the oscillation circuit according to this embodiment is determined on the basis of the ratio of the resistance of the resistor RL1 to the impedance between the drain terminal of the transistor M1 and the GND and the ratio of the resistance of the resistor RL2 to the impedance between the drain terminal of the transistor M2 and the GND.

Oscillation at Frequency Smaller Than Resonance Frequency

A case where the frequency is lower than the resonance frequency of the resonator SAW will be described now. In this case, the impedance magnitude of a serial resonance arm 20 is increased due to the capacitance C1. The impedance magnitude of a parallel capacitor C0 is also increased. On the other hand, the resistance of the resistor Rs1 is constant. Accordingly, the impedance magnitude between the source terminal of the transistor M1 and the GND is the resistance of the resistor Rs1. As a result, the gain of the oscillation circuit according to this embodiment is a ratio of the resistance of the resistor RL1 to the resistance of the resistor Rs1. When the ratio is set to 1 or less, the gain is 1 or less and thus the circuit does not oscillate. That is, when the resistance of the resistor Rs1 is set to be equal to or greater than the resistance of the resistor RL1, the circuit does not oscillate. Similarly, when the resistance of the resistor Rs2 is set to be equal to or greater than the resistance of the resistor RL2, the circuit does not oscillate. In this way, when the frequency is smaller than the resonance frequency of the resonator SAW, it is possible to prevent the oscillation of the oscillation circuit.

Oscillation at Resonance Frequency

It is then considered that the frequency is the resonance frequency of the resonator SAW. In this case, the impedance magnitude of the serial resonance arm 20 is only the resistance of the resistor R1. The resistance of the resistor R1 in the resonator SAW is a very small value, is still smaller than the impedance magnitude of the parallel capacitor C0 and still smaller than the resistance of the resistor Rs1. Accordingly, the impedance of the source terminal 2 of the transistor M1 and the GND is the resistance of the resistor R1. The same is true of the impedance between the source terminal 2' of the transistor M2 and the GND. As a result, the gain of the oscillation circuit according to this embodiment is a very large value. In this way, the oscillation circuit according to this embodiment oscillates at the resonance frequency of the resonator SAW.

Oscillation at Frequency Larger Than Resonance Frequency

It is now considered that the frequency is greater than the resonance frequency of the resonator SAW. In this case, the impedance magnitude of the serial resonance arm 20 is increased due to the inductor L1. On the other hand, the impedance of the parallel capacitor C0 is decreased with the increase in frequency. Since the resistance of the resistor Rs1 is constant, the impedance of the parallel capacitor C0 is dominant in the impedance between the source terminal 2 of the transistor M1 and the GND. In the impedance between the source terminal 2' of the transistor M2 and the GND, the impedance of the parallel capacitor C0 have the smallest value. If the resistance of the resistor RL1 or the resistance of the resistor RL2 is greater than the impedance of the parallel capacitor C0, the gain is greater than 1, thereby causing the oscillation.

Therefore, a capacitor Cp is connected between the drain terminal of the transistor M1 and the drain terminal of the transistor M2. The impedance between the drain terminal of the transistor M1 and the voltage source Vdd and the impedance between the drain terminal of the transistor M2 and the voltage source Vdd are also decreased due to the impedance of the capacitor Cp.

In the gain of the oscillation circuit according to this embodiment, the ratio of the impedance of the capacitor Cp to the impedance of the parallel capacitor C0 is dominant. When the frequency is increased and the impedance of the parallel capacitor C0 is decreased, the decrease in impedance of the parallel capacitor C0 can suppress the gain. In this way, when the frequency is greater than the resonance frequency of the resonator SAW, it is possible to prevent the oscillation of the oscillation circuit.

Here, it is preferable that the capacitance of the capacitor Cp is set to ½ of the capacitance of the parallel capacitor C0. In this case, the impedance of the parallel capacitor C0 and the impedance of the capacitor Cp are equal to each other, thereby more effectively preventing the oscillation at a frequency other than the resonance frequency.

In this embodiment, the resonance frequency of the resonator SAW is employed as the oscillation frequency.

Figure 4:
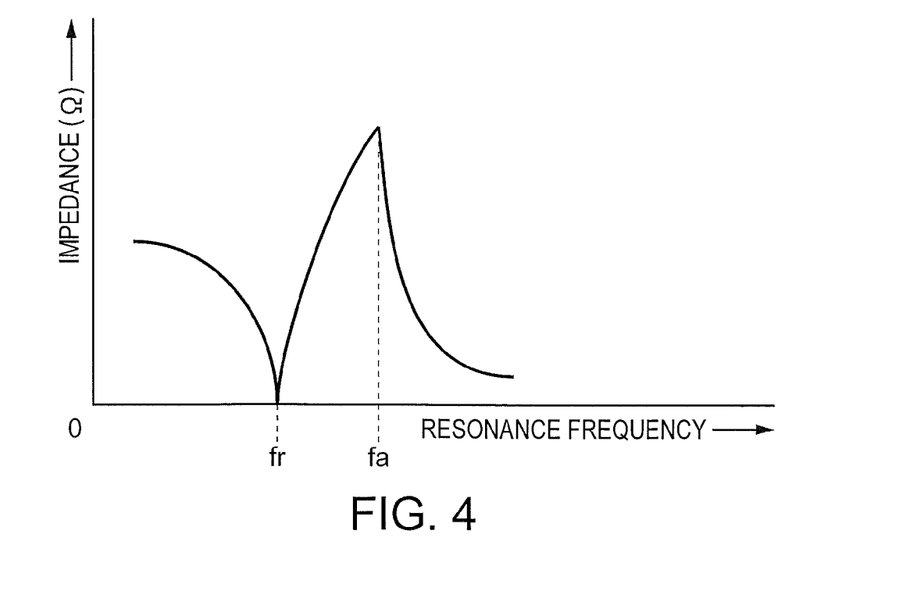
FIG. 4 is a diagram schematically illustrating a relation between resonance frequency and impedance.

FIG. 4 is a diagram schematically illustrating the relation between the resonance frequency and the impedance. As shown in FIG. 4, two points of a resonance point fr and an anti-resonance point fa exist in a vibration mode generally used in oscillation. The resonance point fr is a frequency band where the impedance of the resonator is the smallest and the anti-resonance point fa is a frequency band where the impedance of the resonator is the largest. The band of the anti-resonance point fa is used in U.S. Pat. No. 6,696,899 and the band of the resonance point fr is used in this embodiment.

In view of the resonance characteristic, the Q characteristic of the resonance point fr is more excellent than the Q characteristic of the anti-resonance point fa. That is, this embodiment employing the resonance point fr can provide a more stable vibration characteristic than the example employing the anti-resonance point fa like the above-mentioned related art.

A relation between the resonance frequency and the gain will be described now.

Figure 5:
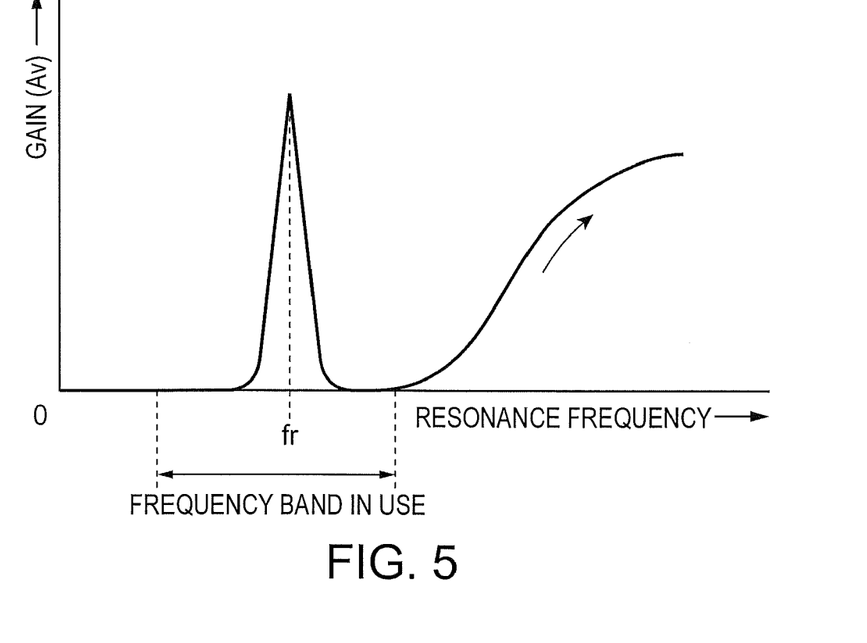
FIG. 5 is a diagram schematically illustrating a relation between resonance frequency and gain.

FIG. 5 is a diagram schematically illustrating a relation between the resonance frequency and the gain Av. In FIG. 5, the gain Av has the largest value at the resonance point fr and the gain Av is increased in a region where the resonance frequency is higher than the frequency band in use. This means that an oscillating region exists in the region higher than the frequency band in use.

Accordingly, the capacitor Cp is provided to fix the impedance of the parallel capacitor C0 in the resonator SAW. Then, the increase in gain in a resonance frequency higher than the resonance frequency is suppressed, thereby preventing the oscillation at a frequency other than the band.

Second Embodiment

An oscillation circuit according to a second embodiment of the invention will be described now. The second embodiment is characterized by including a capacitor connected in parallel to the resistor as the first drain load circuit and a capacitor connected in parallel to the resistor as the second drain load circuit.

Figure 6:
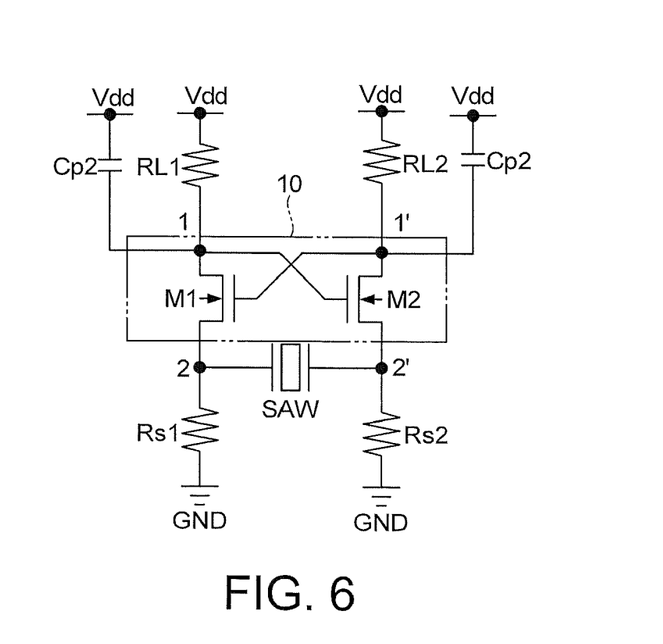
FIG. 6 is a circuit diagram illustrating an oscillation circuit according to a second embodiment of the invention.

FIG. 6 is a circuit diagram illustrating an oscillation circuit according to the second embodiment. In FIG. 6, a capacitor Cp2 connected in parallel to the resistor RL1 is disposed between the drain terminal 1 of the transistor M1 and the voltage source Vdd and a capacitor Cp2 connected in parallel to the resistor RL2 is disposed between the drain terminal 1' of the transistor M2 and the voltage source Vdd. The other configurations are similar to those of the first embodiment (see FIG. 1) and thus description thereof is omitted.

As a result, as described in "Operation of Differential Connection" of the first embodiment, in view of the entire cross-coupled circuit, the current flowing in the drain terminal is ½, thereby reducing the gain required for oscillation of the circuit. When the gain required for the oscillation is small, it is possible to reduce the current. As a result, it is possible to reduce the power consumption of the circuit.

As described in "Oscillation at Frequency greater than Resonance Frequency" of the first embodiment, when the frequency is greater than the resonance frequency of the resonator SAW, it is possible to prevent the oscillation circuit from oscillating.

At this time, it is preferable that the capacitance of the capacitor Cp2 is set to be substantially equal to the capacitance of the parallel capacitor C0. Then, since the impedance of the parallel capacitor C0 and the impedance of the capacitor Cp2 are equal to each other, it is possible to cause the efficient oscillation.

As described in "Oscillation at Frequency smaller than Resonance Frequency", when the frequency is smaller than the resonance frequency of the resonator SAW, the impedance magnitude between the source terminal of the transistor M1 and the GND is the resistance of the resistor Rs1 and when the resistance of the resistor Rs1 is equal to or greater than the resistance of the resistor RL1, the oscillation is not generated. Similarly, when the resistance of the resistor Rs2 is equal to or greater than the resistance of the resistor RL2, the oscillation is not generated. In this way, when the frequency is smaller than the resonance frequency of the resonator SAW, it is possible to prevent the oscillation circuit from oscillating.

Third Embodiment

An oscillation circuit according to a third embodiment of the invention will be described now with reference to the drawings. In the third embodiment, each of the first drain load circuit and the second drain load circuit includes a static current circuit and each of the first source load circuit and the second source load circuit includes a static current circuit.

Figure 7:
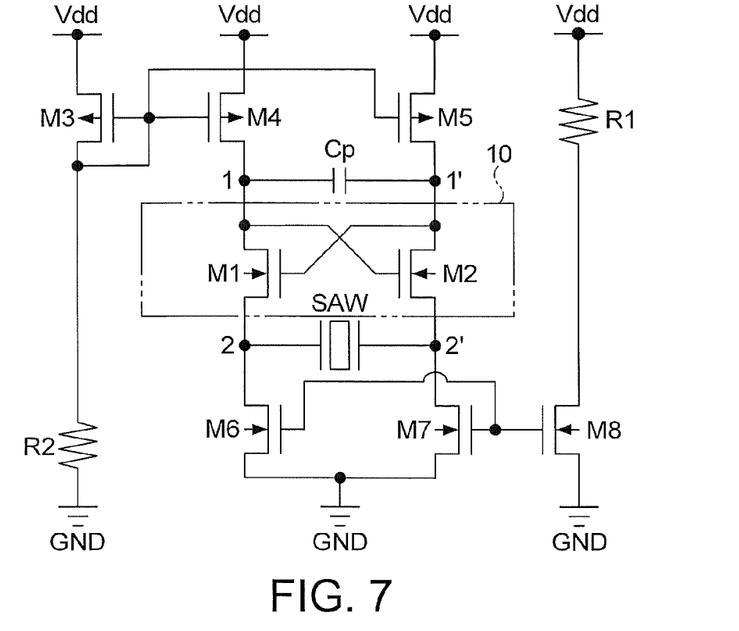
FIG. 7 is a circuit diagram illustrating an oscillation circuit according to a third embodiment of the invention.

FIG. 7 is a circuit diagram illustrating an oscillation circuit according to the third embodiment. In FIG. 7, a static current circuit as the first drain load circuit including transistors M3 and M4 is disposed between the drain terminal 1 of the transistor M1 and the voltage source Vdd. A static current circuit as the second drain load circuit including transistors M3 and M5 is disposed between the transistor M2 and the voltage source Vdd.

The source terminal of the transistor M4 is connected to the drain terminal 1 of the transistor M1 and the drain terminal thereof is connected to the voltage source Vdd. The gate terminal thereof is connected to the gate terminal and the source terminal of the transistor M3 and the gate terminal of the transistor M5. The source terminal of the transistor M3 is connected to the GND through a resistor R2 to form the static current circuit.

The source terminal of the transistor M5 is connected to the drain terminal 1' of the transistor M2 and the drain terminal thereof is connected to the voltage source Vdd. The gate terminal thereof is connected to the gate terminals of the transistors M3 and M4 to form the static current circuit.

On the other hand, the drain terminal of the transistor M6 is connected to the source terminal 2 of the transistor M1, the source terminal thereof is connected to the GND, and the gate terminal thereof is connected to the gate terminal of the transistor M8. The source terminal of the transistor M8 is connected to the GND and the drain terminal thereof is connected to the voltage source Vdd through the resistor R1 to form the static current circuit.

In this case, as described in "Operation of Differential Connection" of the first embodiment, in view of the entire cross-coupled circuit, the current flowing in the drain terminal is ½ and thus the gain required for oscillation of the circuit can be reduced, thereby reducing the current. As a result, it is possible to reduce the power consumption.

As described in Oscillation at Frequency smaller than Resonance Frequency" of the first embodiment, when the impedance magnitude between the source terminal of the transistor M1 and the GND is equal to or greater than the impedance magnitude between the drain terminal of the transistor M1 and the voltage source Vdd and the impedance magnitude between the source terminal of the transistor M2 and the GND is equal to or greater than the impedance magnitude between the drain terminal of the transistor M2 and the voltage source Vdd, it is possible to suppress the oscillation at a frequency smaller than the resonance frequency of the resonator SAW.

As described in "Oscillation at Frequency greater than Resonance Frequency", since the capacitor Cp is provided, it is possible to suppress the oscillation at a frequency greater than the resonance frequency of the resonator SAW.

Fourth Embodiment

An oscillation circuit according to a fourth embodiment of the invention will be described now with reference to the drawings. The fourth embodiment is characterized by including a first source load circuit and a second source load circuit which each have a capacitor and an inductor connected in parallel to each other and a first drain load circuit and a second drain load circuit which each have a capacitor and an inductor connected in parallel to each other.

Figure 8:
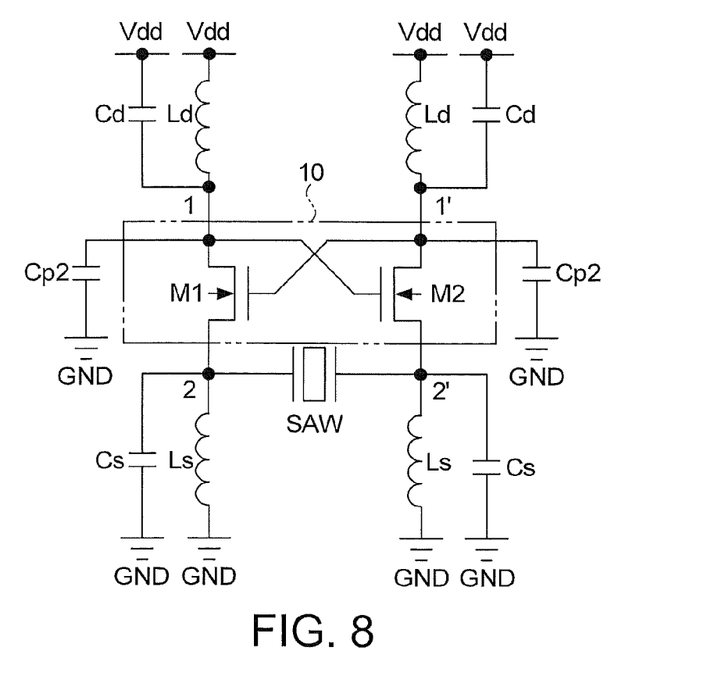
FIG. 8 is a circuit diagram illustrating an oscillation circuit according to a fourth embodiment of the invention.

FIG. 8 is a circuit diagram illustrating an oscillation circuit according to the fourth embodiment. In FIG. 8, a capacitor Cd and an inductor Ld are connected in parallel between the drain terminal 1 of the transistor M1 and the voltage source Vdd. Similarly, a capacitor Cd and an inductor Ld are connected in parallel between the drain terminal 1' of the transistor M2 and the voltage source Vdd.

On the other hand, a capacitor Cs and an inductor Ls are connected in parallel between the source terminal 2 of the transistor M1 and the GND. Similarly, a capacitor Cs and an inductor Ls are connected in parallel between the source terminal 2' of the transistor M2 and the GND.

A capacitor Cp2 is disposed in the source terminal of the transistor M1 and the capacitor Cp2 is connected to the GND. Similarly, a capacitor Cp2 is disposed in the source terminal of the transistor M2 and the capacitor Cp2 is connected to the GND.

That is, the source load circuit and the drain load circuit constitute an LC parallel resonance circuit.

In order to maximize the gain (that is, to facilitate the oscillation) by the use of the cross-coupled circuit, the LC constant can be set to maximize the impedance of the drain terminal side. In this case, since the LC parallel resonance circuit has frequency selectivity, the oscillation can be most easily generated at the resonance frequency.

On the other hand, when the LC constant is set to minimize the impedance of the source terminal side, the gain can be made to the maximum. However, in the LC parallel resonance circuit, since the impedance is the maximum at the resonance frequency, the oscillation can be stopped by matching the desired oscillation frequency with the frequency of the LC parallel resonance circuit.

Therefore, by matching the frequency of the LC parallel resonance circuit connected to the source terminal side with the frequency band of abnormal oscillation, the impedance of the source terminal side can be intentionally increased, thereby suppressing the abnormal oscillation. That is, by matching the LC constant with the frequency band of the abnormal oscillation, it is possible to suppress the abnormal oscillation.

Fifth Embodiment

An oscillation circuit according to a fifth embodiment will be described now with reference to the drawings. The fifth embodiment is characterized in that each of the first source load circuit, the second source load circuit, the first drain load circuit, and the second drain load circuit includes a static current circuit and an amplitude fixation circuit is disposed between the source terminal and the drain terminal of the first active element and between the source terminal and the drain terminal of the second active element.

Figure 9:
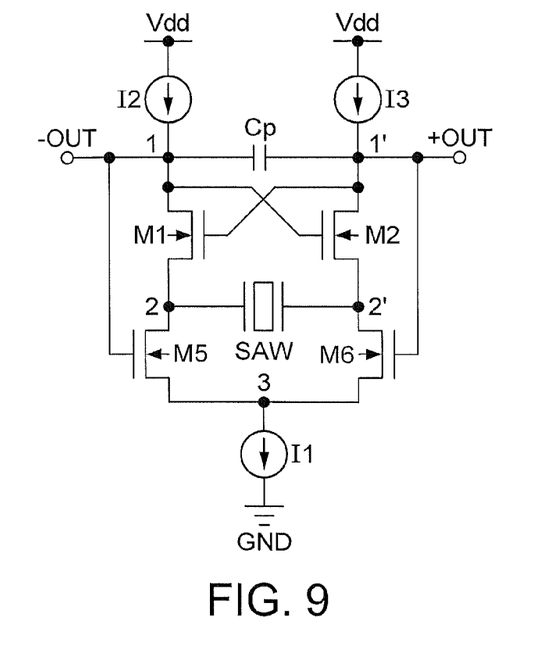
FIG. 9 is a circuit diagram illustrating an example of an oscillator according to a fifth embodiment of the invention.

FIG. 9 is a circuit diagram illustrating an example of the oscillation circuit according to the fifth embodiment. In FIG. 9, a static current circuit I2 as the first drain load circuit is disposed between the drain terminal 1 of the transistor M1 and the voltage source Vdd and a static current circuit I3 as the second drain load circuit is disposed between the drain terminal 1' of the transistor M2 and the voltage source Vdd.

The drain terminal of the transistor M5 is connected to the source terminal of the transistor M1 and the gate terminal is connected to the drain terminal of the transistor M1.

On the other hand, the source terminal 2 of the transistor M1 is connected to a transistor M5 and the source terminal 2' of the transistor M2 is connected to a transistor M6. A static current circuit I1 as the source load circuit is disposed between the common source terminal 3 of the transistor M5 and the transistor M6 and the GND.

The drain terminal of the transistor M6 is connected to the source terminal of the transistor M2 and the gate terminal thereof is connected to the drain terminal of the transistor M2.

The operation of the oscillation circuit is described. It is first described that the amplitude of the resonator SAW is larger than a predetermined amplitude. When the amplitude of the resonator SAW is greater than the predetermined amplitude, the gate voltage of the transistor M5 is increased, thereby increasing the current. Accordingly, the impedance of the drain terminal side is decreased, thereby decreasing the source voltage and the gate voltage of the transistor M1. Then, the drain voltage and the source voltage of the transistor M2 are also decreased, thereby reducing the current. Then, the gate voltage and the drain voltage of the transistor M1 are decreased. Accordingly, the oscillation amplitude is reduced. In this way, the oscillation amplitude is self adjusted so as to be constant. Therefore, in this embodiment, the circuit including the transistors M5 and M6 is called the amplitude fixation circuit.

According to this configuration, the output amplitude of the oscillation circuit is fixed by providing the amplitude fixation circuit. When the output amplitude is fixed, it is possible to reduce the oscillation start time.

Since a circuit not depending on the common mode of an active element exists, it is not affected by the mismatch or offset between the first active element and the second active element. For this reason, it is also possible to reduce the start time and to embody an oscillation circuit and an oscillator which can be driven with a low voltage and which have noise resistance.

Modified Example of Fifth Embodiment

An oscillation circuit according to a modified example of the fifth embodiment will be described now with reference to the drawings. This modified example is different from the fifth embodiment (see FIG. 9) in position of the static current circuit disposed on the source terminal sides of the transistors M1 and M2.

Figure 10:
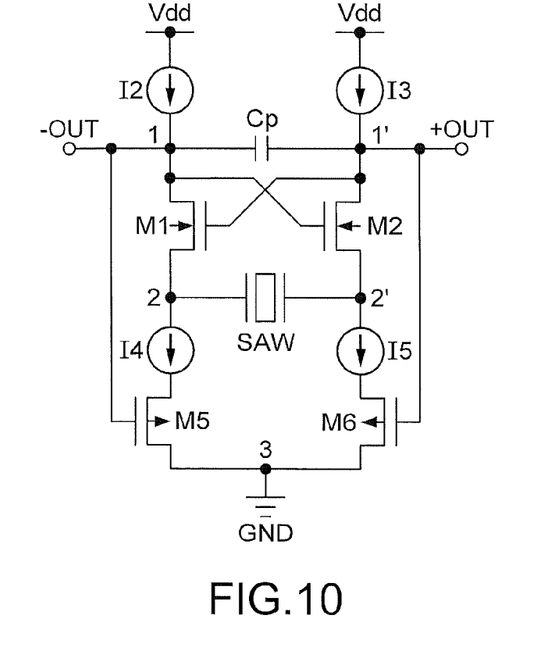
FIG. 10 is a circuit diagram illustrating an oscillation circuit according to a modified example of the fifth embodiment of the invention.

FIG. 10 is a circuit diagram illustrating an oscillation circuit according to the modified example of the fifth embodiment of the invention. In FIG. 10, a static current circuit I4 is connected between the transistor M1 and the transistor M5 and a static current circuit I5 is connected between the transistor M2 and the transistor M6. The common source terminal 3 of the transistors M5 and M6 are connected to the GND.

The same operational advantage as the fifth embodiment (see FIG. 9) can be obtained from this configuration.

Sixth Embodiment

An oscillation circuit according to a sixth embodiment of the invention will be described now with reference to the drawings. The sixth embodiment is different from the fifth embodiment (see FIG. 10) in configuration of the differential connection portion. Accordingly, although the configurations other than the differential connection portion may be the same as described in the first to fifth embodiments, the configuration of the fifth embodiment (see FIG. 10) will be used herein as a basic structure.

Figure 11:
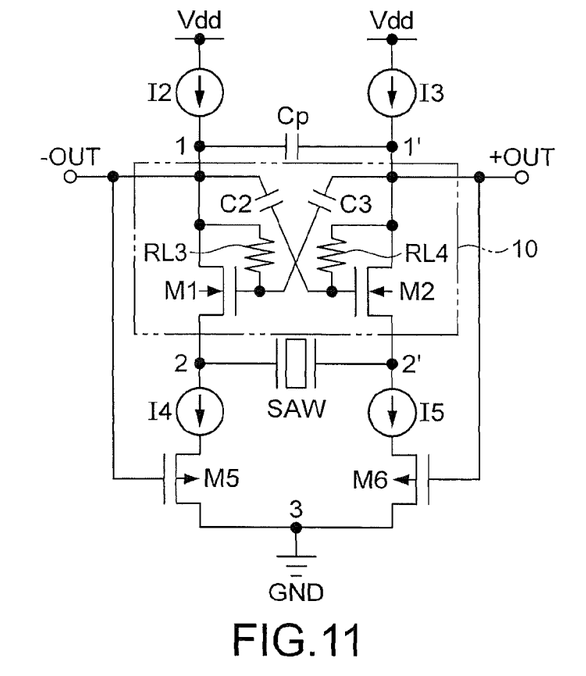
FIG. 11 is a circuit diagram illustrating an example of an oscillation circuit according to a sixth embodiment of the invention.

FIG. 11 is a circuit diagram illustrating an example of an oscillation circuit according to the sixth embodiment of the invention. In the cross-coupled circuit 10 shown in FIG. 11, a capacitor C3 is connected between the gate terminal of the transistor M1 and the drain terminal of the transistor M2 and a capacitor C2 is connected between the gate terminal of the transistor M2 and the drain terminal of the transistor M1.

A resistor RL3 is connected between the gate terminal and the drain terminal of the transistor M1 and a resistor RL4 is connected between the gate terminal and the drain terminal of the transistor M2.

According to this configuration, by disposing the capacitors C2 and C3 and the resistors RL3 and RL4 while differentially connecting the transistor M1 and the transistor M2 to each other, the gate and the drain of the MOS transistor are loosely connected (separated in impedance to the maximum), thereby improving the linearity of the circuit (reducing the deformation of the circuit) and suppressing the high-frequency oscillation. As a result, it is possible to improve the noise resistance.

Seventh Embodiment

An oscillation circuit according to a seventh embodiment of the invention will be described now with reference the drawings. The seventh embodiment is characterized in that an amplifier is disposed between the gate terminal and the drain terminal of the transistor M1 and between the gate terminal and the drain terminal of the transistor M2. Accordingly, although the configurations other than the differential connection portion may be the same as described in the fifth and sixth embodiments, the configuration of the sixth embodiment (see FIG. 11) will be used as a basic structure.

Figure 12:
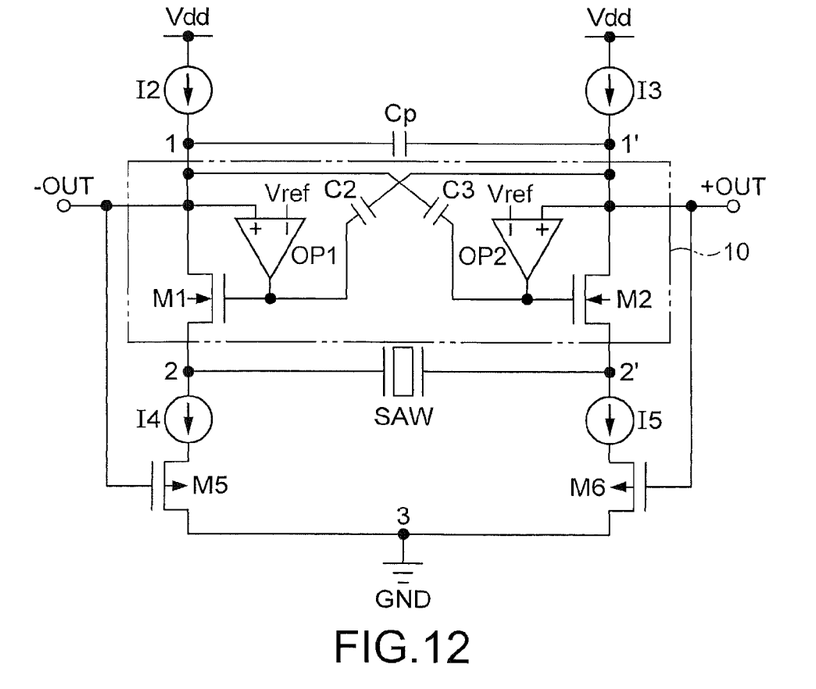
FIG. 12 is a circuit diagram illustrating an example of an oscillation circuit according to a seventh embodiment of the invention.

FIG. 12 is a circuit diagram illustrating an example of an oscillation circuit according to the seventh embodiment. In FIG. 12, an amplifier OP1 is connected between the gate terminal and the drain terminal of the transistor M1 and an amplifier OP2 is connected between the gate terminal and the drain terminal of the transistor M2.

A capacitor C2 is connected between the gate terminal of the transistor M1 and the drain terminal of the transistor M2 and a capacitor C3 is connected between the gate terminal of the transistor M2 and the drain terminal of the transistor M1.

In the oscillation circuit having the above-mentioned configuration, by disposing the capacitors C2 and C3 and the amplifiers OP1 and OP2 while differentially connecting the transistor M1 and the transistor M2 to each other, the gate and the drain of the MOS transistors are loosely connected, thereby improving the linearity of the circuit (reducing the deformation of the circuit) and suppressing the high-frequency oscillation. As a result, it is possible to improve the noise resistance.

By properly setting the amplification ratios of the amplifiers OP1 and OP2, the gate voltages of the transistors M1 and M2 can be adjusted to desired values, thereby easily designing the oscillator.

The invention is not limited to the above-mentioned embodiments, but may be modified in various forms without departing from the gist thereof. For example, the following modifications may be made.

In the above-mentioned embodiments, it has been described that the first active element and the second active element are an Nch transistor. However, the first active element or the second active element may be any one of a Pch transistor, and Si—BiCMOS, a Si bipolar transistor, a SiGe bipolar transistor, a GaAs-MOSFET, a GaAs-HEMT, an InP-HEMT, a P-HEMT, and an HBT.

In the above-mentioned embodiments, a surface acoustic wave (SAW) element has been exemplified as the resonator. However, the resonator may be anyone of a thickness adjusting resonator such as an AT resonator, an MEMS resonator, and a BAR resonator such as SMR or FBAR.

In the above-mentioned embodiments, it has been described that the first source load circuit and the second source load circuit have the same configuration and that the first drain load circuit and the second drain load circuit have the same configuration. However, the first source load circuit and the second source load circuit may not have the same configuration and the configurations described in the above-mentioned embodiments may be properly combined. For example, the first source load circuit may be a resistor and the second source load circuit may be a static current circuit. The first drain load circuit may be a filter circuit and the second drain load circuit may be a resistor.

According to the first to seventh embodiments, it is possible to provide an oscillation circuit and an oscillator, which can reduce the current consumption, can prevent the oscillation in a frequency band other than the resonance frequency, can reduce an oscillation start time, and is excellent in Q characteristic and noise resistance.

The entire disclosure of Japanese Patent Application No. 2008-026011, filed Feb. 6, 2008 is expressly incorporated by reference herein.

What is claimed is:

1. An oscillation circuit comprising:
    a cross-coupled circuit having a first active element and a second active element that are differentially connected to each other,
    a capacitor connected between the drain terminal of the first active element and the drain terminal of the second active element,
    wherein the oscillation circuit oscillates in a resonance frequency of a resonator connected between the first active element and the second active element,
    a source terminal of the first active element is connected to GND through a first source load circuit,
    a source terminal of the second active element is connected to GND through a second source load circuit,
    a drain terminal of the first active element is connected to a voltage source through a first drain load circuit,
    a drain terminal of the second active element is connected to a voltage source through a second drain load circuit,
    a first source impedance includes an impedance of the first source load circuit and an impedance of the resonator,
    a first drain impedance includes an impedance of the first drain load circuit and an impedance of the capacitor,
    a second source impedance includes an impedance of the second source load circuit and the impedance of the resonator,
    a second drain impedance includes an impedance of the second drain load circuit and the impedance of the capacitor,
    the impedance of the capacitor is equal to a parallel capacitance of the resonator,
    the first source impedance is equal to or greater than the first drain impedance, and
    the second source impedance is equal to or greater than the second drain impedance.

2. The oscillation circuit according to claim 1, wherein each of the first source load circuit, the second source load circuit, the first drain load circuit, and the second drain load circuit includes a static current circuit.

3. The oscillation circuit according to claim 1, wherein each of the first source load circuit and the second source load circuit includes a capacitor and an inductor connected in parallel to each other, and
    wherein each of the first drain load circuit and the second drain load circuit includes a capacitor and an inductor connected in parallel to each other.

4. The oscillation circuit according to claim 1, wherein each of the first source load circuit, the second source load circuit, the first drain load circuit, and the second drain load circuit includes a static current circuit, and
    wherein an amplitude fixation circuit is disposed between the source terminal and the drain terminal of the first active element and between the source terminal and the drain terminal of the second active element.

5. The oscillation circuit according to claim 4, wherein a capacitor is disposed between the gate terminal of the first active element and the drain terminal of the second active element and between the gate terminal of the second active element and the drain terminal of the first active element.

6. The oscillation circuit according to claim 4 further comprising:
    a first amplifier disposed between the gate terminal and the drain terminal of the first active element; and
    a second amplifier disposed between the gate terminal and the drain terminal of the second active element.

* * * * *